United States Patent
Whitcombe et al.

(10) Patent No.: US 12,355,465 B2
(45) Date of Patent: Jul. 8, 2025

(54) LOW NOISE INVERTER-BASED VOLTAGE-TO-TIME CONVERTER WITH COMMON MODE INPUT TRACKING

(71) Applicant: Intel Corporation, Santa Clara, CA (US)

(72) Inventors: Amy Whitcombe, Saratoga, CA (US); Somnath Kundu, Hillsboro, OR (US); Brent R. Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 544 days.

(21) Appl. No.: 17/558,056

(22) Filed: Dec. 21, 2021

(65) Prior Publication Data

US 2023/0198510 A1 Jun. 22, 2023

(51) Int. Cl.
*H03K 4/94* (2006.01)
*H03K 5/01* (2006.01)
*H03M 1/50* (2006.01)
*H03M 1/82* (2006.01)

(52) U.S. Cl.
CPC ............... *H03M 1/50* (2013.01); *H03K 4/94* (2013.01); *H03K 5/01* (2013.01); *H03M 1/82* (2013.01)

(58) Field of Classification Search
CPC . H03K 4/94; H03K 5/01; H03M 1/50; H03M 1/82

USPC .............. 327/100, 130; 341/155, 166
See application file for complete search history.

(56) References Cited

U.S. PATENT DOCUMENTS

| | | | | |
|---|---|---|---|---|
| 11,012,083 B1 * | 5/2021 | Waltari | ................. | G04F 10/005 |
| 11,716,089 B1 * | 8/2023 | Verbruggen | ............ | H03M 1/54 |
| | | | | 341/144 |
| 2019/0226922 A1 * | 7/2019 | Kim | ........................ | G05F 3/26 |

OTHER PUBLICATIONS

Liu, Juzheng, "A 10GS s 8b 25fJ c-s 2850um2 Two-Step Time-Domain ADC Using Delay-Tracking Pipelined-SAR TDC with 500fs Time Step in 14nm CMOS Technology", 2022 IEEE International Solid-State Circuits Conference, (Feb. 22, 2022), 3 pgs.

* cited by examiner

*Primary Examiner* — William Hernandez
(74) *Attorney, Agent, or Firm* — Schwegman Lundberg & Woessner, P.A.

(57) ABSTRACT

A differential voltage-to-time converter (VTC) architecture and method of providing VTC signals are disclosed. The VTC includes a ramp generator that generates a ramp voltage, capacitors having a bottom plate coupled with the ramp generator to receive the ramp voltage, and inverters having inputs coupled to top plates of the capacitors to provide signals based on a sampled signal. A threshold voltage or supply voltage of the inverters tracks a minimum input signal voltage.

20 Claims, 11 Drawing Sheets

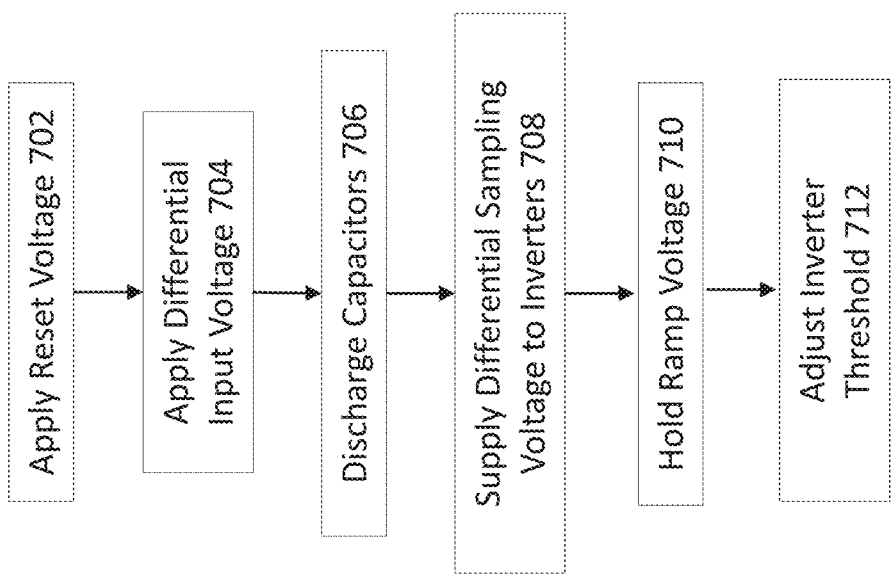

LOW NOISE INVERTER-BASED VOLTAGE-TO-TIME CONVERTER WITH COMMON MODE INPUT TRACKING

TECHNICAL FIELD

Embodiments described herein pertain to voltage-to-time converters (VTCs).

BACKGROUND

Power efficient and linear voltage-to-time converters (VTCs) are one building block in time-domain circuits such as data converters and frequency synthesizers in receiver circuitry, for example. In a receiver, the received radio frequency (RF) analog signal is supplied to an Analog-to-Digital Converter (ADC), after which the bits from the ADC are provided to a processor such as a Digital Signal Processor (DSP). Time-based ADCs are used to provide high-speed and low power ADCs in such environments. In time-based ADCs, the input voltage is initially converted to a pulse delay time using a Voltage-to-Time Converter (VTC) circuit. The pulse delay time is subsequently converted to a digital word by using a Time-to-Digital Converter (TDC) circuit. Because of the high clock speed and low input capacitance requirements, VTC circuits have become increasingly popular recently for achieving high sampling rates and bandwidths in a manner that is well suited to Complementary Metal-Oxide-Semiconductor (CMOS) technology scaling due to the relatively low power consumption and small die area used. However, the noise and linearity of the VTC circuitry are bottlenecks limiting the resolution of these time-domain circuits; optimizing linearity often leads to sacrificing VTC gain.

BRIEF DESCRIPTION OF THE DRAWINGS

FIG. 7 shows a method of VTC operation, according to some embodiments described herein.

DETAILED DESCRIPTION

A technique is described herein to improve VTC resolution by using a high linearity voltage ramp to implement the voltage-to-time conversion and by reducing sensitivity to noise in the ramp. Robust VTC architectures that can maximize gain and speed while tracking environment changes may be used to reduce the sensitivity of the time-domain circuits to voltage and temperature fluctuations. Thus, a technique to make VTC performance independent of common mode input voltage is provided.

Figure 1B:
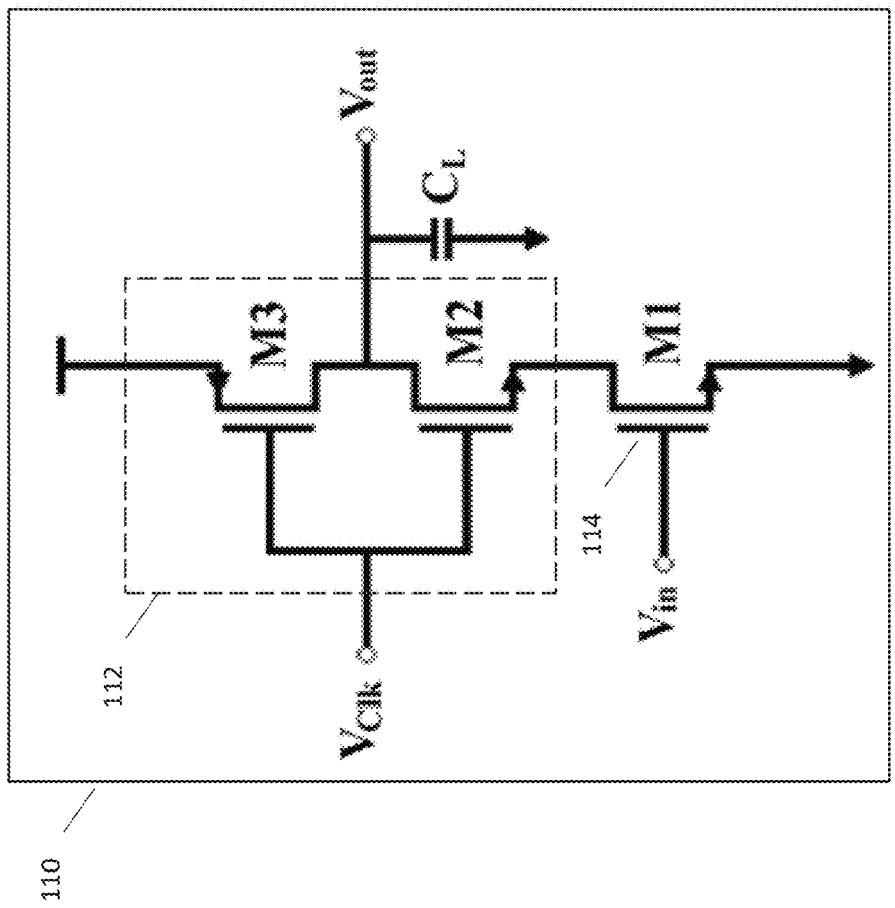
FIG. 1B shows a current starving inverter, according to some embodiments described herein.
Figure 1A:
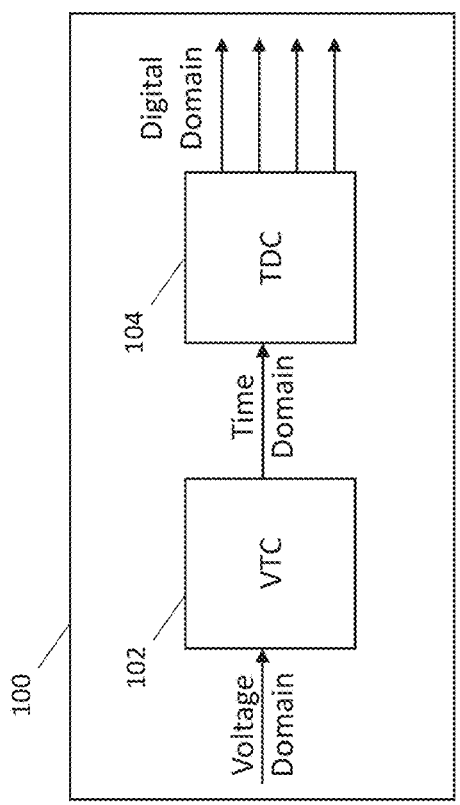
FIG. 1A shows a time-based ADC, according to some embodiments described herein.

FIG. 1A shows a time-based ADC, according to some embodiments described herein. The time-based ADC 100 includes a VTC 102 to which a voltage domain input signal is supplied. The VTC 102 provides a time domain output signal to a TDC 104. That is, the VTC 102 converts the input voltage signal to delay pulses as the time domain output signal. The delay of each pulse is proportional to the value of the input voltage signal. The TDC 104 converts the delay pulses to a number of digital domain signals (digital word).

One implementation of the VTC 102 is shown in FIG. 1B. In particular, FIG. 1B shows a current starving inverter 110, according to some embodiments described herein. As shown, a CMOS inverter 112 is connected with a starving NMOS transistor 114 (M1). The input voltage Vin is connected to the gate of the starving NMOS transistor 114. The input voltage Vin controls the current of the driver branch when the CMOS inverter 112 changes from high to low. That is, the fall time of the output voltage Vout of the CMOS inverter 112 is proportional to the input voltage signal Vin. In FIG. 1B, the input voltage, Vin, controls the delay of the falling edge of the clock signal, Vclk, through the CMOS inverter 112 by controlling the discharging current of the starving NMOS transistor 114.

Figure 1C:
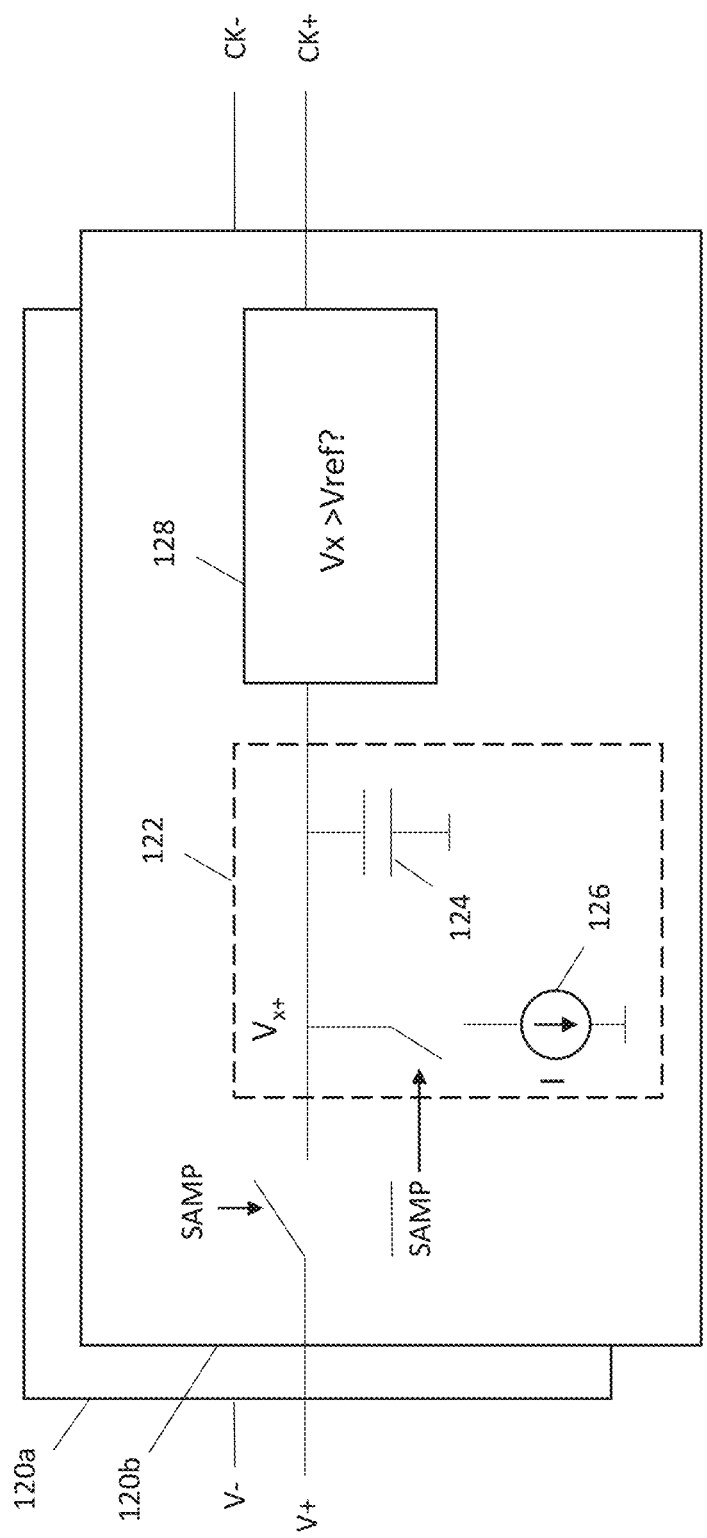
FIG. 1C shows a high level VTC view, according to some embodiments described herein.

FIG. 1C shows a high level VTC view, according to some embodiments described herein. A high level view of the VTC 120a, 120b may include a ramp generator 122 constructed from a capacitor 124 and current source 126, and a detector circuit 128. The ramp generator 122 generates a voltage that essentially decreases linearly in time. The detector circuit 128 determines when the ramp crosses a predetermined threshold value. In some implementations, the input voltage V+, V− is sampled using a sample control signal SAMP onto the capacitor 124 and the ramp is generated by directly discharging the sampled voltage $V_{x+}$ with a fixed reference current I from the current source 126 using the inverse of SAMP. Pseudo-differential architectures where two identical single-ended VTCs 120a, 120b operate in parallel, may be used to generate the differential clock signal CK+, CK−.

The threshold detection circuit 128 can be implemented multiple ways. Some architectures use a digital logic gate, such as the inverter shown in FIG. 1B, or a NOR gate as a threshold detector. In such implementations, the reference voltage $V_{REF}$ is not controlled explicitly but determined by the intrinsic threshold voltage of the gate. While logic gate-based detectors are relatively simple to implement and may improve noise by maximizing the transconductance of the detector, the threshold voltage of the detectors is sensitive to device mismatch, supply variation, and temperature fluctuations. Extra design margin used to compensate for such fluctuations restricts the achievable output swing or speed of the VTC. Alternately, another VTC architecture uses a differential amplifier to compare the ramp voltage against an external reference voltage. This enables direct adjustment of the VTC threshold but requires extra DC power consumption in the detector and may increase its input-referred noise.

Alternate VTC designs use a transconductor to convert the input voltage to a current source, which is used to discharge a capacitor that is reset to a fixed voltage to generate a variable-slope ramp as in FIG. 1B. While the transconductor can be implemented with a differential pair circuit to provide the benefits of a fully differential structure, the transconductor is highly sensitive to nonlinearity. This approach uses either a small input swing or linearity correction techniques that may be sensitive to device mismatch and poorly suited to CMOS processes.

The VTC performance is limited by non-linearity and noise. Moreover, optimizing linearity often involves sacrificing VTC gain, which uses finer TDC resolution. A technique is provided herein to improve VTC resolution by facilitating the use of a high linearity voltage ramp to implement the voltage-to-time conversion and reduce noise sensitivity in the ramp. Robust VTC architectures that can maximize gain and speed while tracking environment changes are useful because time-domain circuits are highly sensitive to voltage and temperature fluctuations. To that end, a technique to promote the independence of the VTC performance from a common mode input voltage is disclosed herein. The VTC used may be used, for example, in high-speed data converters and frequency synthesis circuits.

VTC Architecture & Ramp Generation

Figure 2A:
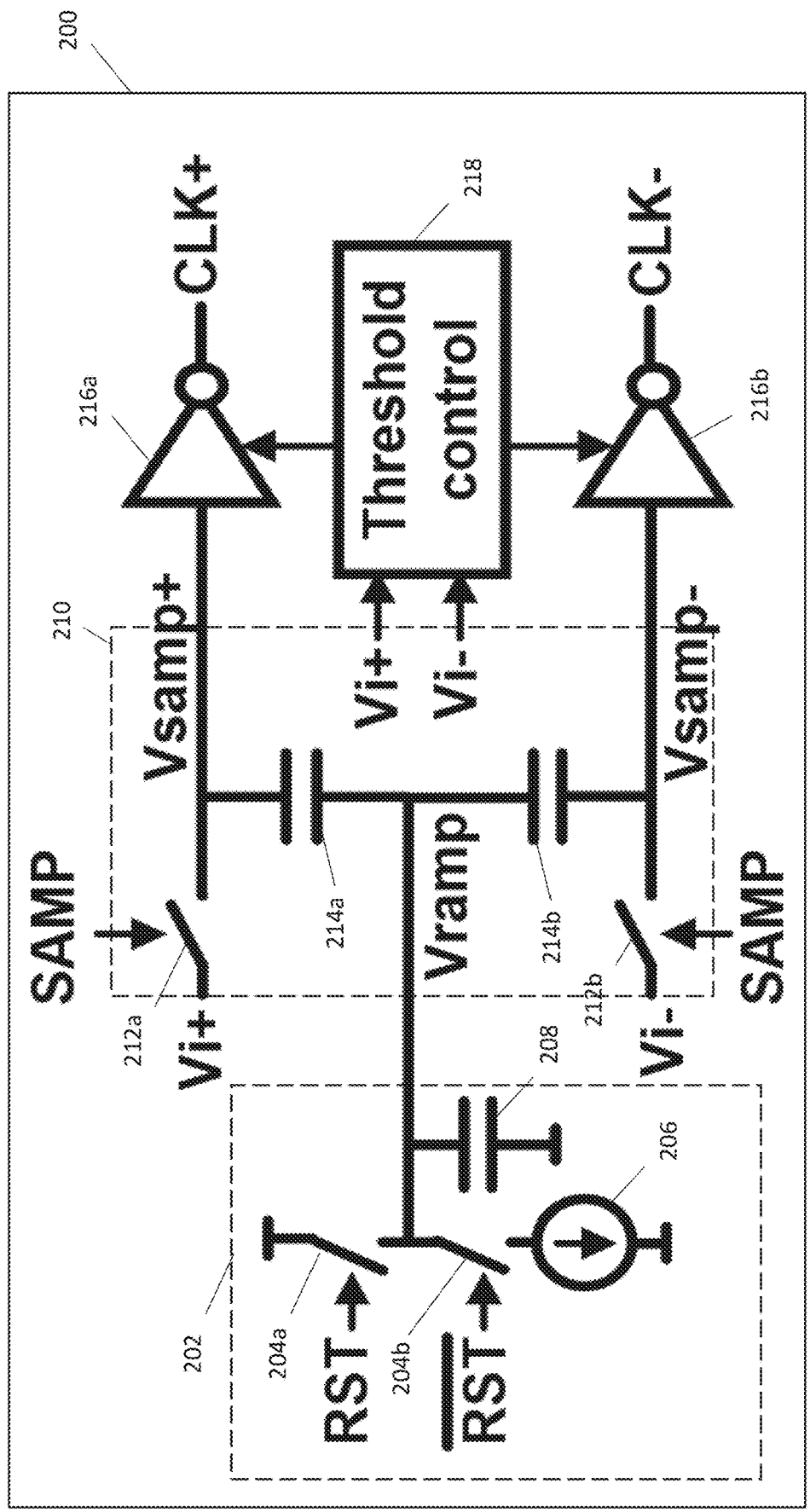
FIG. 2A shows a high-level diagram of a VTC architecture, according to some embodiments described herein.

FIG. 2A shows a VTC architecture, according to some embodiments described herein. The VTC 200 includes a differential sampling capacitance 210 with a single ramp voltage generator 202 driving the bottom plate voltage of both halves of the sampling capacitors 214a, 214b. The top plate voltages of the sampling capacitors 214a, 214b are connected to inverters 216a, 216b with adjustable threshold voltages that are set by a threshold control circuit 218. The threshold control circuit 218 may be used to adjust the inverter threshold to track the minimum input signal voltage, which is the common mode of the differential signal minus the peak signal swing. Specifically, as the common mode signal is relatively constant, changing slowly with voltage/temperature, the inverter threshold control circuit may merely track the minimum expected signal voltage, which can be generated as a shifted version of the fixed common mode.

Initially, the differential input voltage V+, V− of the VTC 200 is sampled onto two capacitors 214a, 214b with a common bottom plate voltage Vramp supplied by the single ramp voltage generator 202. The ramp voltage generator 202 includes a ramp capacitor 208, a current source 206 and a pair of reset switches 204a, 204b. The bottom plate voltage of both halves of the sampling capacitors 214a, 214b are connected to the ramp capacitor 208. A reset voltage RST and inverse reset voltage RST is respectively applied to the reset switches 204a, 204b to charge the ramp capacitor 208 from a supply (or other high) voltage and discharge the ramp capacitor 208 using the current source 206. In some embodiments, the inverse reset voltage may be obtained by applying the reset voltage to an inverter such that the reset switches are actuated asynchronously.

The differential sampling capacitance 210 contains sampling switches 212a, 212b in addition to the sampling capacitors 214a, 214b. A sampling application voltage SAMP is applied to the sampling switches 212a, 212b to supply a positive input voltage Vi+ and a negative input voltage Vi− of a differential voltage signal to respective top plates of the sampling capacitors 214a, 214b. The differential voltage signal Vi+, Vi− is also supplied to the threshold control circuit 218. The sampling application voltage SAMP and the reset voltage RST are pulses having different pulse widths in which the pulse width of the reset voltage RST is larger than that of the sampling application voltage SAMP.

In operation, the bottom plate voltage of the sampling capacitors 214a, 214b is reset to a high voltage (e.g., the supply voltage) during the sampling phase and then discharged with a fixed current supplied by the current source 206 to generate a ramp signal Vramp that is common to the bottom plate voltages of the sampling capacitors 214a, 214b. This capacitively couples to the top plate voltages of 214a, 214b Vsamp+, Vsamp−. When Vsamp+ and Vsamp−, which are respectively supplied to inputs of the inverters 216a, 216b, cross the threshold voltage of the inverters 216a, 216b, the output clock signals CLK+ and CLK− transition from low to high. While the threshold control circuit 218 may supply independent threshold voltages to both inverters 216a, 216b, in some embodiments, the same threshold voltage is supplied to both inverters 216a, 216b. Once both output clock signals CLK+, CLK− are high, the ramp voltage Vramp can be held at the reset voltage until a new sample arrives and a new sampling application voltage SAMP is applied to the sampling switches 212a, 212b.

Figure 2B:
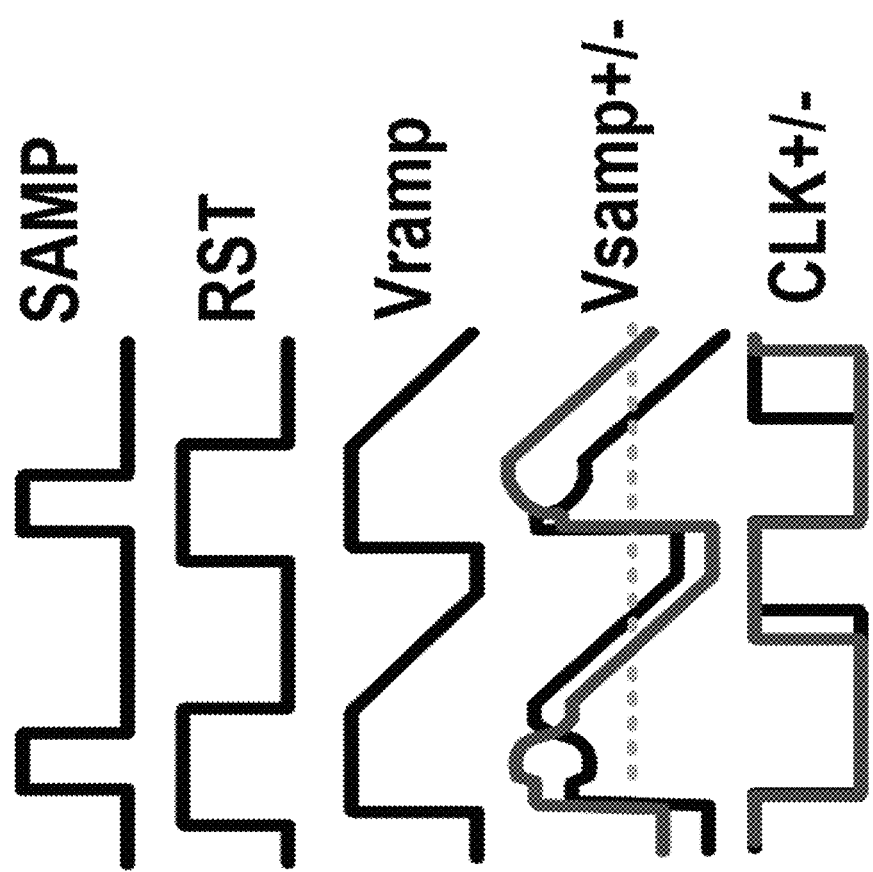
FIG. 2B shows a timing diagram of the VTC architecture of FIG. 2A, according to some embodiments described herein.

FIG. 2B shows a timing diagram of the VTC of FIG. 2A, according to some embodiments described herein. As shown, the reset voltage RST and inverse reset voltage RST are applied to the reset switches 204a, 204b to set the bottom plate voltage of the sampling capacitors 214a, 214b to $V_{DD}$ (supply voltage) and charge the ramp capacitor 208. That is, the ramp voltage Vramp is set to $V_{DD}$ when the reset voltage RST goes high. As a consequence, when the sampling application voltage SAMP is supplied to the sampling switches 212a, 212b, the sampling voltage Vsamp+, Vsamp− is referred to a constant bottom plate voltage on sampling capacitors 214a, 214b. That is, the Vramp signal is fixed during sampling so that the voltage sampled onto the capacitors 214a, 214b is referred to AC ground. When SAMP is high, the sampling voltage Vsamp+, Vsamp− rises to track the input voltage Vi+, Vi− from FIG. 2A and holds this value at the falling edge of SAMP. After RST falls and triggers the discharge of Vramp, Vramp couples to Vsamp+, Vsamp− through capacitors 214a, 214b. Vsamp+, Vsamp− fall through the threshold of the threshold control circuit 218, thereby triggering the inverters 216a, 216b to supply high clock signals CLK+, CLK−. That is, the sampling voltage Vsamp+, Vsamp− passing through the threshold voltage triggers the rising clock edge of the corresponding clock signal CLK+, CLK−. When CLK+, CLK− are both high, RST can be raised again for the new sample. Note that although specific shapes are shown for the sampling voltage Vsamp+, Vsamp−, the voltages may be different, changing the timing (but not amplitude) of the clock signals CLK+, CLK− accordingly.

As above, the VTC 200, Vramp is initially reset to $V_{DD}$ (supply voltage) and discharged to $V_{SS}$ (ground). In a complementary implementation of the VTC 200, Vramp is initially reset to $V_{SS}$ and charged to $V_{DD}$. Such an embodiment may be used in architectures in which the input common mode is skewed low.

Sharing the ramp signal Vramp allows low-frequency noise from the ramp generator 202 to be cancelled differentially. By using capacitive coupling supplied by the sampling capacitors 214a, 214b to apply the ramp signal Vramp to both signal paths, the ramp reset voltage is also independent of the signal common mode. Linearity can therefore be improved by initializing the ramp signal Vramp to a high voltage, which increases the VDs of the ramp current source 206, improving its output resistance. In this design, the size of the ramp capacitor 208 is also independent of the capacitance of the sampling capacitors 214a, 214b, so the capacitance of the ramp capacitor 208 can be increased. This may create a shallow ramp for high VTC gain without reducing the VTC bandwidth. In some embodiments, the reset controls could be made synchronous, though the asynchronous implementation in which the reset occurs immediately after the last VTC output transition helps maximize the reset time.

Inverter Threshold Control

The VTC 200 translates the ramp voltages Vramp to a digital output signal with an inverter 216a, 216b. Inverters are reasonable detectors because the combined transconductance of the PMOS and NMOS transistors in the inverters leads to low input-referred noise. In addition, the inverter may only draw power during the edge transition. However, one disadvantage of an inverter-based detector is the susceptibility of its threshold to process fluctuations during manufacture of the detector, as well as operational fluctuations caused by voltage and temperature. Accurate threshold control is used to maximize VTC gain, which can minimize the relative contribution of noise.

Figure 2C:
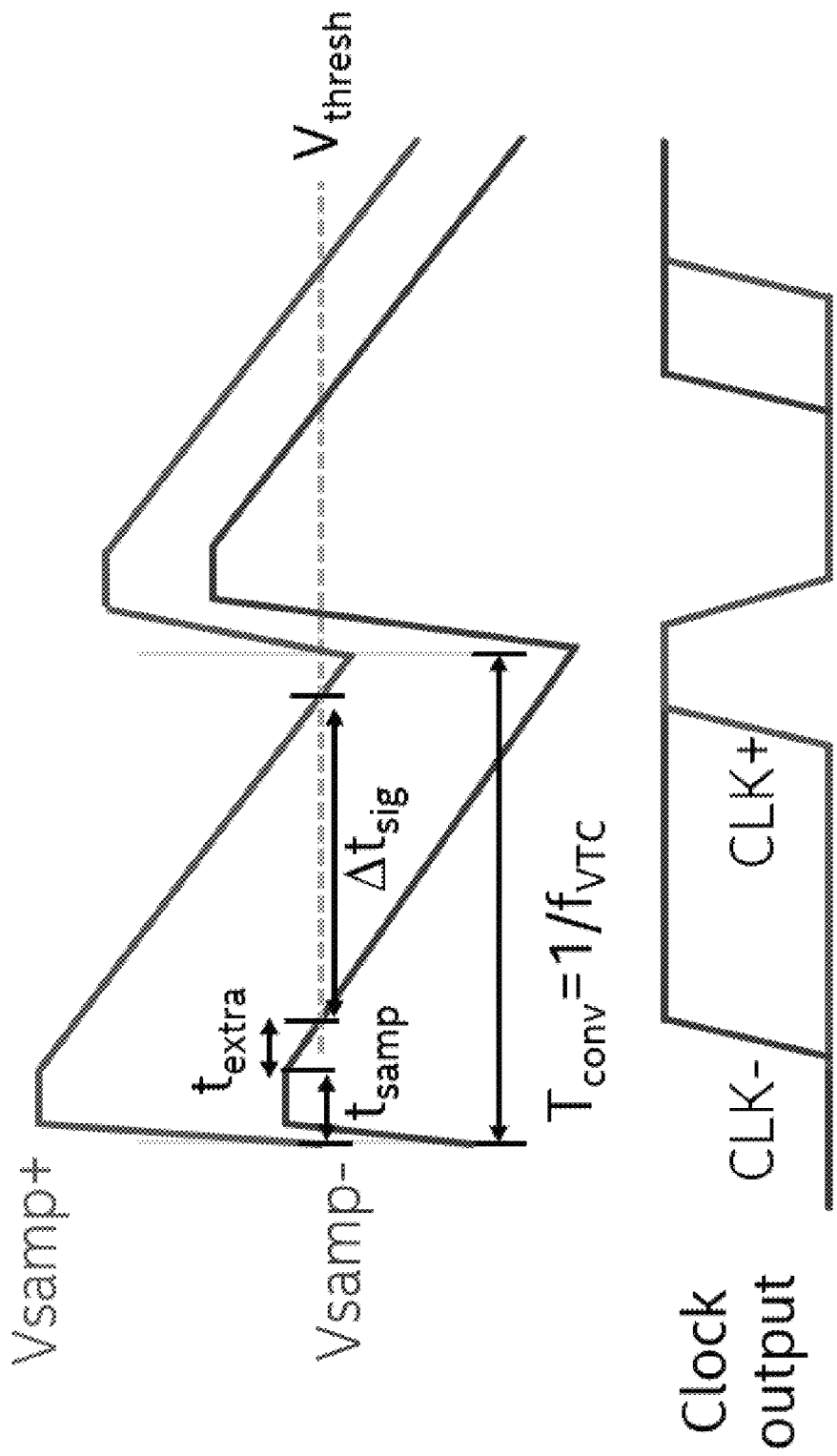
FIG. 2C shows a timing diagram of VTC operation, according to some embodiments described herein.

FIG. 2C shows a timing diagram of the sample voltages of FIG. 2A, according to some embodiments described herein. As illustrated in FIG. 2C, the total allowable conversion time ($T_{conv}$) includes the reset and signal sampling time $t_{samp}$ (when the reset voltage RST is high), the time-domain output swing $\Delta t_{sig}$ (the time between both sampling voltages Vsamp+, Vsamp− crossing the threshold voltage $V_{thresh}$ as the sampling voltages Vsamp+, Vsamp− decrease) and additional time $t_{extra}$ for the first signal to cross the threshold voltage $V_{thresh}$ (that is, the time from when the reset voltage RST transitions to low to when the first of the sampling voltages Vsamp+, Vsamp− crosses the threshold voltage $V_{thresh}$). The time-domain output swing $\Delta t_{sig}$ is thus the time between the clock signals CLK+, CLK− reaching a high voltage. To maximize the VTC sample rate ($f_{VTC}=1/T_{conv}$), $t_{extra}$ is minimized by ensuring that the threshold voltage $V_{thresh}$ stays near the minimum signal level, that is, is set as close as possible to the minimum voltage of the smallest of the sampling voltages Vsamp+, Vsamp−. If the threshold voltage $V_{thresh}$ is set incorrectly, the VTC 200 may not transition in the desired clock period.

Figure 3:
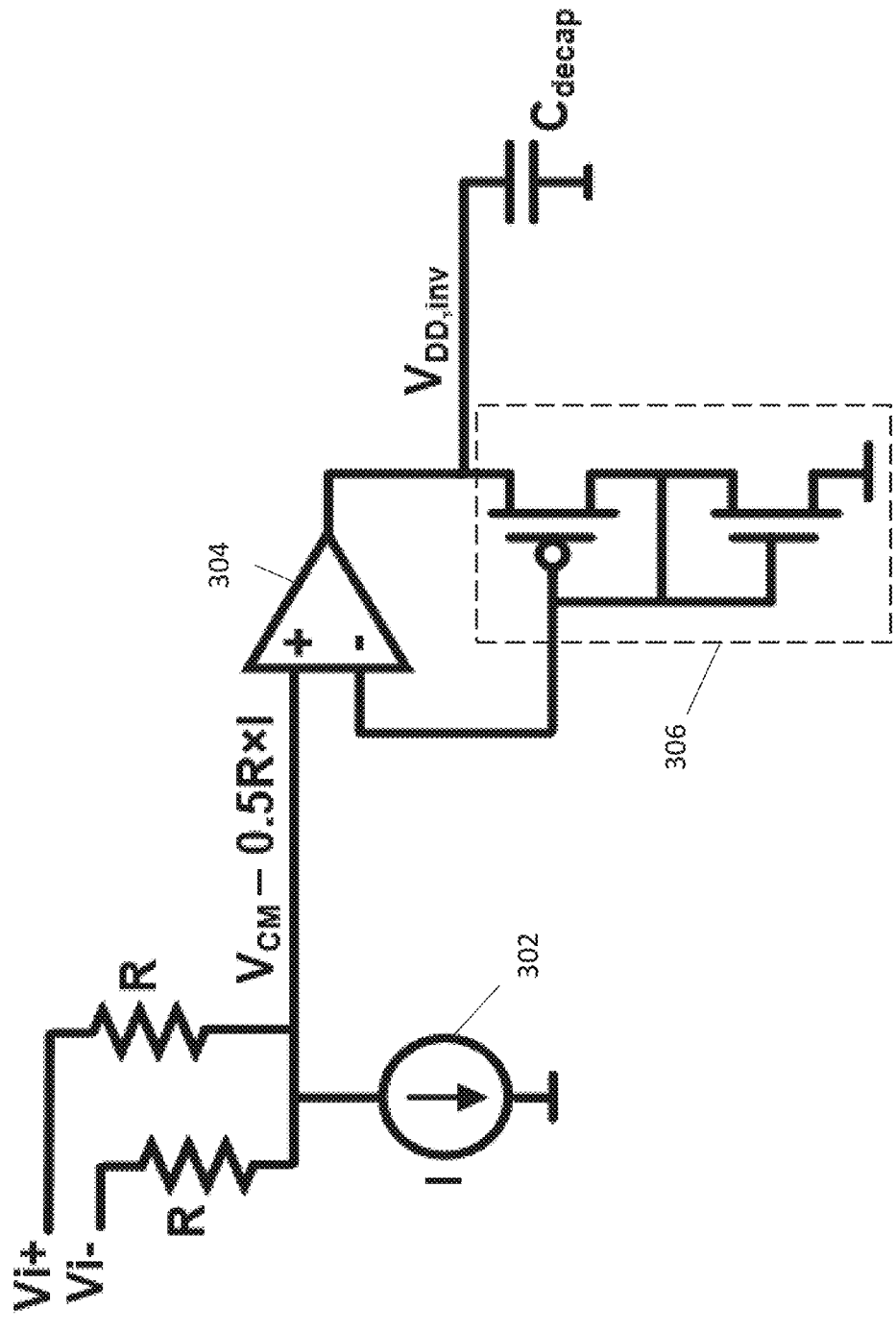
FIG. 3 shows an inverter supply generation circuit, according to some embodiments described herein.

As described above, in some embodiments, the threshold voltage may be set using a continuous-time comparator with an external reference or a logic gate-based detector. However, a continuous-time comparator is power-hungry, while a logic gate-based detector may not have been designed to control the threshold voltage. To overcome these issues, the inverter threshold may be modulated by scaling the supply voltage of the inverter to track the input common mode. In some embodiments, adjustment of the inverter supply voltage (and thus the threshold voltage) may be provided by using a replica inverter to determine the threshold voltage. FIG. 3 shows an inverter supply voltage generation circuit, according to some embodiments described herein.

The inverter supply generation circuit 300 shown in FIG. 3 may be used to generate the inverter supply. This inverter supply generation circuit 300 first generates a reference voltage that is a shifted (i.e., reduced) version of the input common mode ($V_{CM}$) by feeding a current, supplied by a current source 302, through equal resistors R that are both connected to an input of a differential amplifier 304. The differential voltage pair Vi+, Vi− is supplied to the opposite terminal of resistors R to detect the input common mode $V_{CM}$. The resulting output voltage is the target threshold voltage $V_{CM}$−0.5RI, where the resistance R and/or the current I can be tuned to set the term 0.5RI just above the peak expected input signal swing. The target threshold voltage is supplied to the positive input of the differential amplifier 304 and can be compared to the actual threshold of a replica inverter 306. The replica inverter 306 has a proportional size to the inverters 216a, 216b used in the VTC 200. That is, the replica inverter 306 may be fabricated on the same semiconductor substrate as the inverters 216a, 216b to have a size that is a scaled down version of the inverters 216a, 216b (e.g., one half, one quarter, one sixth, one eighth, one tenth, one twentieth in size). The input and output of the replica inverter 306 can be shorted to estimate the threshold of the replica inverter 306. The shorted input/output of the replica inverter 306 is supplied to the negative input of the differential amplifier 304 to provide feedback. The feedback is used to adjust the supply voltage of the replica inverter 306 (connected to the output of differential amplifier 304) to match the threshold with the target threshold voltage $V_{CM}$−0.5RI. The supply voltage can be used to drive the inverters 216a, 216b in the VTC 200. The use of the replica inverter 306 permits the threshold voltage of the main inverters 216a, 216b to continuously track the minimum input signal voltage.

Figure 4:
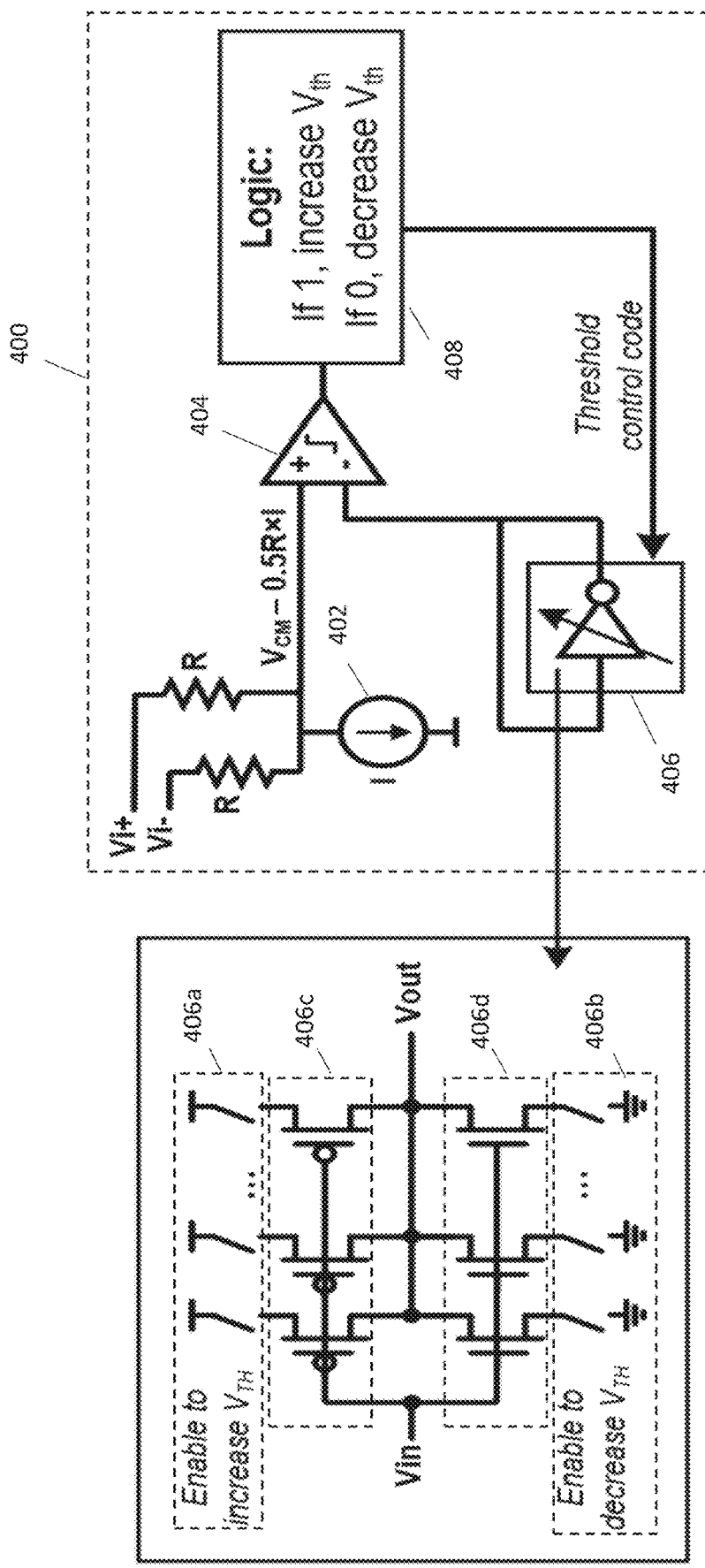
FIG. 4 shows an inverter control circuit, according to some embodiments described herein.

FIG. 4 shows an inverter control circuit, according to some embodiments described herein. The inverter control circuit 400 may contain elements similar to the inverter supply generation circuit 300 shown in FIG. 3: the inverter control circuit 400 generates the shifted input common mode $V_{CM}$ by feeding the current from a current source 402 through the resistors R connected to the positive input of a comparator 404. The comparator 404 may be clocked using a system clock of the device in which the inverter control circuit 400 is disposed to provide an output at predetermined times. The output of the inverter 406 is connected to the inverter input to estimate the threshold voltage and is supplied to the negative input of the comparator 404. The output voltage from the comparator 404 is supplied to a digital logic circuit 408, whose output is a control code (digital word) used to control the inverter 406. This permits the inverter threshold to be tuned by digital control to track the minimum input signal voltage. As shown, the control code of the digital logic circuit 408 controls switches 406a, 406b of the inverter 406 such that each bit of the control code controls a different switch 406a, 406b (or any number of each set of the switches 406a or set of the switches 406b). In particular, the digital logic circuit 408 is able to connect or disconnect each of the PMOS devices 406c using a respective PMOS switch 406a and each of the NMOS devices 406d using a respective NMOS switch 406b. Thus, the digital logic circuit 408 adjusts the effective size of the NMOS and PMOS devices 406c, 406d in the inverter 406. As in FIG. 3, the input and output of the inverter 406 are tied together. The input of the inverter 406 is coupled to the gates of the NMOS and PMOS devices 406c, 406d; the output of the inverter 406 is coupled to the drains of the PMOS devices 406c and the drains of the NMOS devices 406d.

The optimal control settings of the digital logic circuit 408 may be determined using a clocking of the comparator 404 to increase or decrease the threshold voltage relative to the detected target voltage. If the output voltage of the comparator 404 is 1 (the target voltage is greater than the threshold voltage), the digital logic circuit 408 enables one or more of the inactive/disconnected PMOS devices 406c (and/or disables one or more of the active NMOS devices 406*d*) using the PMOS switches 406*a* (and/or NMOS switches 406*b*) to increase the threshold voltage of the inverter 406; if the output voltage of the comparator 404 is 0 the target voltage is less than the threshold voltage), the digital logic circuit 408 enables one or more of the inactive/ disconnected NMOS devices 406*d* (and/or disables one or more of the active PMOS devices 406*c*) using the NMOS switches 406*b* (and/or PMOS switches 406*a*) to decrease the threshold voltage of the inverter 406. Note that while NMOS and PMOS devices are described, in other embodiments, other transconductance devices may be used. Similarly, in other embodiments, only one of the PMOS devices 406*c* or NMOS devices 406*d* may be able to be activated/disactivated using the corresponding switches.

In some embodiments, the control settings of the digital logic circuit to adjust the inverters in the VTC may be set as a one-time or periodic foreground calibration (e.g., after a predetermined amount of time has passed from the last calibration or in the event of a predetermined condition occurring, such as a temperature change over a predetermined amount detected by a sensor in a device in which the VTC is incorporated). In other embodiments, the calibration may operate continuously in the background. In this case, the calibration may be determined using a replica inverter as above. The threshold control settings determined for the replica inverter may be fed to the main inverters used by the VTC.

Figures 5A, 5B:
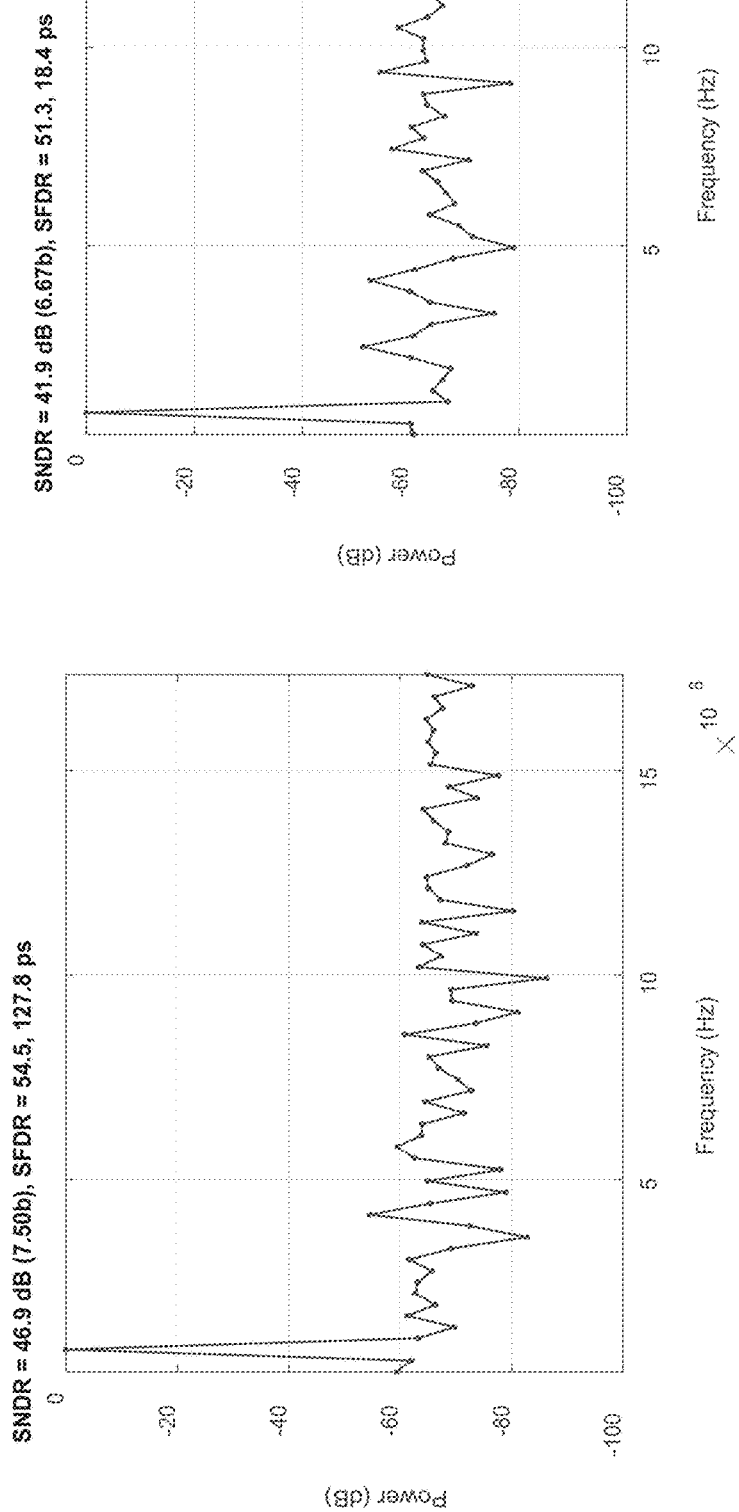
FIG. 5A shows a frequency response of a VTC implementation with a shared ramp, according to some embodiments described herein.
FIG. 5B shows a frequency response of a conventional VTC implementation with separate ramps, according to some embodiments described herein.
Figure 5D:
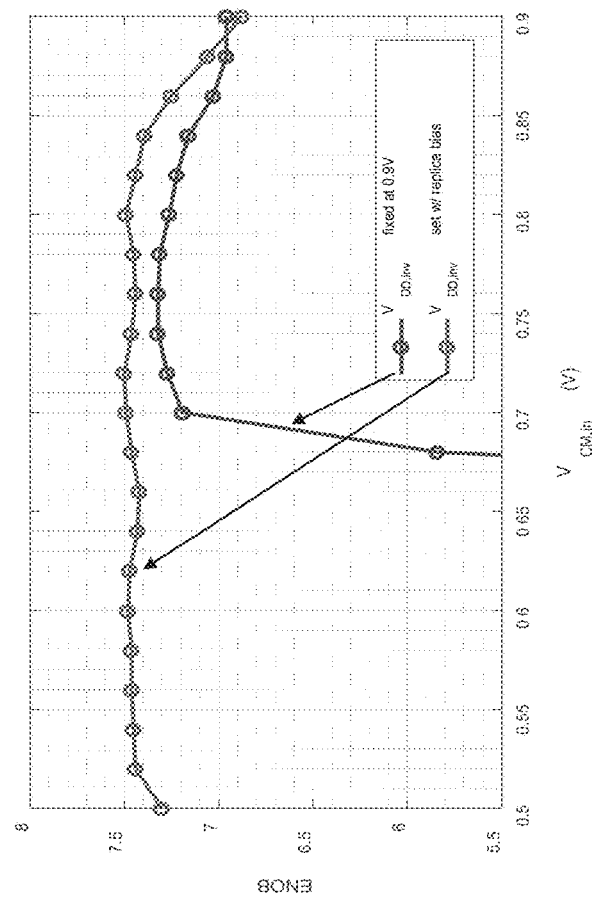
FIG. 5D shows a VTC resolution with and without the inverter supply generation circuit shown in FIG. 3, according to some embodiments described herein.
Figure 5C:
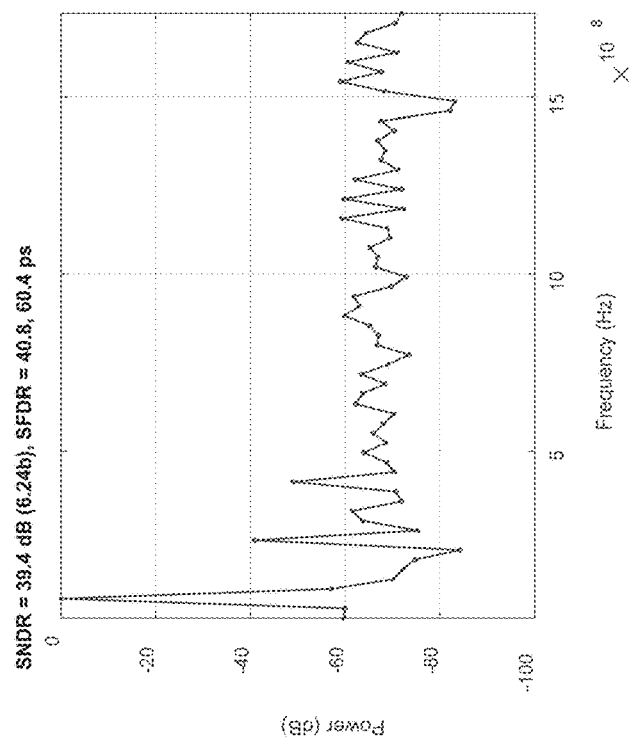
FIG. 5C shows a frequency response of a VTC implementation with shared ramp and lower ramp bias current than the arrangement of FIG. 5B, according to some embodiments described herein.

To evaluate the noise and linearity improvement of the shared ramp architecture, transient noise simulations of the VTC shown in FIG. 2A were compared to a conventional VTC with independent ramp signals. Specifically, FIG. 5A shows a frequency response of a VTC implementation with shared ramp, according to some embodiments described herein; FIG. 5B shows a frequency response of a conventional VTC implementation with separate ramps, according to some embodiments described herein; FIG. 5C shows a frequency response of a conventional VTC implementation with a lower ramp bias current than the arrangement of FIG. 5B, according to some embodiments described herein; and FIG. 5D shows resolution as a function of input common mode with and without the threshold control circuit shown in FIG. 3. The simulations shown in FIGS. 5A-5D used a 500 mVpp differential input swing. The simulation shown in FIG. 5C used a 70% lower ramp bias current than the arrangement of FIG. 5B. The VTC 200 of FIG. 2A was simulated using a supply voltage of 1.1 V, a 70 fF ramp capacitor 208, and 22 fF sampling capacitors 214*a*, 214*b*; while the arrangement of FIG. 5C was simulated using a 22 fF capacitor 214. In the arrangement of FIGS. 5A and 5B, the NMOS devices used to generate the current source 206 were identically sized. The inverter supply was provided by the analog replica-based supply generator circuit shown in FIG. 3. As simulated, the ramp capacitor 208 had a larger capacitance than that of the sampling capacitors 214*a*, 214*b* by a factor of about 3. Increasing the capacitance of the ramp capacitor 208 provides a shallower ramp slope, which accordingly increases VTC gain.

The output spectra of the VTCs in FIGS. 5A and 5B show a VTC time-domain output swing of 127.8 ps and 18.4 ps. The results show that the VTC of FIG. 5A provides both about a 5 dB higher signal-to-noise-and-distortion ratio (SNDR) due to the ramp noise cancellation (46.9 dB in the simulation of FIG. 5A, 41.9 dB in the simulation of FIG. 5B), 3 dB higher spurious free dynamic range (SFDR) (54.5 in the simulation of FIG. 5A, 51.3 in the simulation of FIG. 5B), and greater than about 6× (16 dB) larger output swing.

The power consumption of the simulation of FIG. 5A is about 50% higher than that of the simulation of FIG. 5B due to the ramp capacitor reset. In the VTC of FIG. 5B, the capacitor reset current is taken from the buffer driving the VTC.

The gain is low in the VTC of FIG. 5B because the same discharge current is applied to a capacitor nearly one quarter of the size of the capacitor in the VTC of FIG. 5A. However, linearity may be an issue in the VTC of FIG. 5B with increasing VTC output swing. The output spectrum in FIG. 5C shows the behavior of the VTC of FIG. 5B when the bias current devices are scaled down to increase the VTC output swing. With a larger output swing of 60.4 ps, the SNDR decreases from 41.9 dB to 39.4 dB and the SFDR drops by 10 dB from 51.3 to 40.8 because of the limited linearity of the current source. Thus, the VTC of FIG. 5A still provides about a 2× larger output swing and better linearity than the VTC of FIG. 5C.

FIG. 5D illustrates the effectiveness of the common mode input tracking circuit. In particular, FIG. 5D illustrates the VTC performance with an analog inverter signal generation circuit shown in FIG. 3 compared to the VTC performance with a fixed inverter supply. The plot compares the VTC effective number of bits (ENOB) obtained from transient noise simulations in both cases. When the supply voltage is fixed, the ENOB drops sharply when the common mode is under 0.7V, but the replica biasing circuit offers about 0.2b better performance across input bias levels and maintains this resolution for an input common mode down to about 0.5V.

Figure 6:
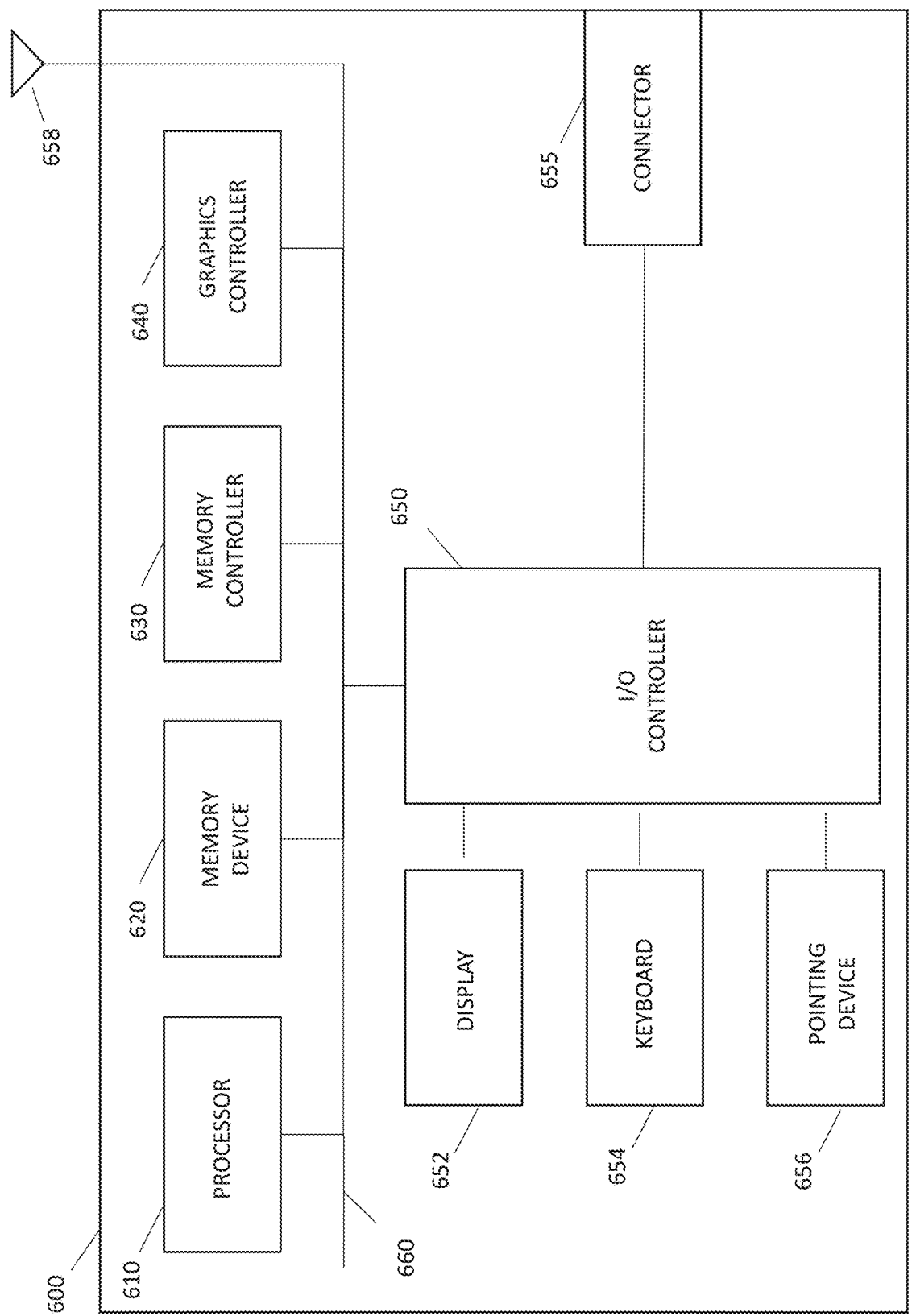
FIG. 6 shows an apparatus in the form of a system, according to some embodiments described herein.

FIG. 6 shows an apparatus in the form of a system (e.g., electronic system) 600, according to some embodiments described herein. System 600 may include or be included in a computer, a tablet, or other electronic system. As shown in FIG. 6, system 600 may include components located on a circuit board (e.g., printed circuit board (PCB)) 602, such as a processor 610, a memory device 620, a memory controller 630, a graphics controller 640, an I/O controller 650, a display 652, a keyboard 654, a pointing device 656, at least one antenna 658, a connector 655, and a bus 660. Display 652 may include a liquid crystal display (LCD), a touchscreen (e.g., capacitive or resistive touchscreen), or another type of display. Pointing device 656 may include a mouse, a stylus, or another type of pointing device. Bus 660 may include conductive lines (e.g., metal-based traces on a circuit board where the components of system 600 are located).

Processor 610 may include a general-purpose processor, an application specific integrated circuit (ASIC), or other kinds of processors. Processor 610 may include a CPU. Memory device 620 may include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 may be located on the same die. In such an alternative arrangement, memory device 620 is an embedded memory in processor 610, such as embedded DRAM (eDRAM), embedded SRAM (eSRAM), embedded flash memory, or another type of embedded memory.

U/O controller 650 may include a communication module for wired or wireless communication (e.g., communication through one or more antenna 658). Such wireless communication may include communication in accordance with WiFi communication technique, Long Term Evolution Advanced (LTE-A) communication technique, or other communication techniques. I/O controller 650 may also include a module to allow system 600 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 655 may be arranged (e.g., may include terminals, such as pins) to allow system 600 to be coupled to an external device (or system). This may allow system 600 to communicate (e.g., exchange information) with such a device (or system) through connector 655. Connector 655 and at least a portion of bus 660 may include conductive lines that conform with at least one of USB, DP, HDMI, Thunderbolt, PCIe, Ethernet, and other specifications. As shown in FIG. 6, each of processor 610, memory device 620, memory controller 630, graphics controller 640, and I/O controller 650 may be present.

FIG. 6 shows the components of system 600 arranged separately from each other as an example. For example, each of processor 610, memory device 620, memory controller 630, graphics controller 640, and I/O controller 650 may be located on a separate IC (e.g., semiconductor die or an IC chip). In some arrangements, two or more components (e.g., processor 610, memory device 620, graphics controller 640, and I/O controller 650) of system 600 may be located on the same die (e.g., same IC chip) that may be part of a system on chip, a system in a package, or other electronic devices or systems, The illustrations of the circuit described above are intended to provide a general understanding of the structure of different embodiments, and are not intended to provide a complete description of all the elements and features of an apparatus that might make use of the structures described herein. In some arrangements, system 600 does not have to include a display. Thus, display 652 may be omitted from system 600. In some arrangements, system 600 does not have to include any antenna. Thus, antenna 658 may be omitted from system 600. In some arrangements, system 600 does not have to include a connector. Thus, connector 655 may be omitted from system 600.

FIG. 7 illustrates a method of converting a signal from an analog voltage to a time domain signal. The method may be performed by any of the VTCs shown and described in the above figures. Embodiments of the method may thus include additional or fewer operations or processes in comparison to what is illustrated in FIG. 7. In addition, embodiments of the method are not necessarily limited to the chronological order that is shown in FIG. 7.

At operation 702, a reset voltage is applied during a first period to the bottom plate of a pair of capacitors having a common bottom plate voltage. The reset voltage is a high voltage.

At operation 704, a differential input voltage is applied to the top plate of the capacitors during a second period. The second period occurs within the first period.

At operation 706, the capacitors are discharged after the first period. The capacitors are discharged using a fixed current to generate a ramp signal that is common to a differential sampling voltage on the capacitors.

At operation 708, the differential sampling voltage is supplied to inverters to, when the differential sampling voltage crosses an inverter threshold voltage, trigger a transition of the inverters to switch output clocks from low to high.

At operation 710, the ramp voltage is held at a reset voltage until a next sampling period after the output clocks are high.

At operation 712, the inverter threshold of the inverters is adjusted by scaling the supply voltage of the inverters to track the input common mode. In particular, the inverter threshold is adjusted to track the minimum signal voltage. As above, this operation may occur at any point in the method 700, before or during any one or more of the operations 702-710, depending on the threshold control implementation. For example, in the analog control technique shown in FIG. 3, the inverter threshold adjustment may occur continuously with the replica circuit.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

EXAMPLES

Example 1 is a differential voltage-to-time converter (VTC) comprising: a ramp generator configured to generate a ramp voltage; a differential capacitance comprising first and second capacitors coupled with the ramp generator to receive the ramp voltage; and first and second inverters having inputs coupled to the differential capacitance to provide signals based on a sampled signal, the first inverter coupled to the first capacitor, the second inverter coupled to the second capacitor.

In Example 2, the subject matter of Example 1 includes that the ramp generator comprises a ramp capacitor coupled to the differential capacitance, the ramp capacitor coupled to a voltage source through a first reset switch to charge the ramp capacitor and a current source through a second reset switch to discharge the ramp capacitor.

In Example 3, the subject matter of Examples 1-2 includes that the inputs of the first and second inverters are coupled to positive and negative input voltages through first and second sampling switches configured to be synchronously actuated by a sample pulse.

In Example 4, the subject matter of Examples 1-3 includes that the first and second inverters have a fixed threshold.

In Example 5, the subject matter of Examples 1-4 further includes an inverter supply generation circuit to adjust a supply voltage of the first and second inverters to configure a threshold voltage of the first and second inverters to track a minimum voltage of the sampled signal.

In Example 6, the subject matter of Example 5 includes that the inverter supply generation circuit comprises: circuitry configured to generate a shifted version of an input common mode signal, a differential amplifier having a first input configured to receive the shifted version of the input common mode signal and an output configured to provide the supply voltage, and a replica inverter coupled to a second input of the differential amplifier, a size of the replica inverter proportional to a size of each of the first and second inverters.

In Example 7, the subject matter of Example 6 includes that: an input and output of the replica inverter are shorted together, the first input of the differential amplifier is a positive input, and the second input of the differential amplifier is a negative input.

In Example 8, the subject matter of Examples 6-7 includes that the circuitry comprises: a pair of matched resistors configured to receive an input differential signal to generate the common mode signal, and a current source coupled with the pair of matched resistors, a junction between the current source and the pair of matched resistors coupled to the first input of the differential amplifier to provide the shifted version of the input common mode signal to the first input of the differential amplifier.

In Example 9, the subject matter of Examples 1-8 further includes a threshold control circuit coupled to the first and second inverters to control a threshold voltage of the first and second inverters to track a minimum voltage of the sampled signal.

In Example 10, the subject matter of Example 9 includes that the threshold control circuit comprises: circuitry configured to generate a shifted version of an input common mode, a comparator having a first input configured to receive the shifted version of the input common mode, a logic circuit coupled to an output of the comparator, the logic circuit configured to provide a control code based on the output of the comparator, and a threshold-tunable inverter coupled to a second input of the comparator, the threshold-tunable inverter configured to receive the control code and adjust the threshold voltage of the first and second inverters based on the control code.

In Example 11, the subject matter of Example 10 includes that the threshold-tunable inverter comprises: a plurality of first transconductance devices and a plurality of first switches, each first transconductance device having a source coupled to a first voltage through a corresponding first switch and a gate coupled to an input voltage, and a plurality of second transconductance devices and a plurality of second switches, each second transconductance device having a source coupled to a second voltage through a corresponding second switch, a drain coupled to a drain of corresponding first transconductance device to an output of the threshold inverter, and a gate coupled to the input voltage, the plurality of first and second switches actuated based on the control code to adjust the threshold voltage.

In Example 12, the subject matter of Example 11 includes that each bit of the control code controls a different one of the plurality of first and second switches.

In Example 13, the subject matter of Examples 1-12 further includes a plurality of threshold control circuits, each of the threshold control circuits coupled to a different inverter of the first and second inverters to adjust a threshold voltage of the inverter.

Example 14 is an electronic device, comprising: a differential voltage-to-time converter (VTC) comprising: a ramp generator configured to generate a ramp voltage; a differential capacitance comprising first and second capacitors having a bottom plate coupled with the ramp generator to receive the ramp voltage; and first and second inverters having inputs coupled to top plates of the first and second capacitors to provide signals based on a sampled signal, the first inverter coupled to the first capacitor, the second inverter coupled to the second capacitor, at least one of a supply voltage or a threshold voltage of the first and second inverters being adjusted based on environmental conditions; and a processor configured to receive an output signal from the VTC.

In Example 15, the subject matter of Example 14 further includes an inverter supply generation circuit to adjust a supply voltage of the first and second inverters to configure a threshold voltage of the first and second inverters to track a minimum voltage of the sampled signal.

In Example 16, the subject matter of Example 15 includes that the inverter supply generation circuit comprises: circuitry configured to generate a shifted version of an input common mode signal, a differential amplifier having a first input configured to receive the shifted version of the input common mode signal and an output configured to provide the supply voltage, and a replica inverter coupled to a second input of the differential amplifier, a size of the replica inverter proportional to a size of each of the first and second inverters, an input and output of the replica inverter shorted together.

In Example 17, the subject matter of Examples 14-16 further includes a threshold control circuit coupled to the first and second inverters to control a threshold voltage of the first and second inverters to track a minimum voltage of the sampled signal.

In Example 18, the subject matter of Example 17 includes that the threshold control circuit comprises: circuitry configured to generate a shifted version of an input common mode, a comparator having a first input configured to receive the shifted version of the input common mode, a logic circuit coupled to an output of the comparator, the logic circuit configured to provide a control code based on the output of the comparator, and a threshold-tunable inverter coupled to a second input of the comparator, the threshold-tunable inverter configured to receive the control code and adjust the threshold voltage of the first and second inverters based on the control code.

Example 19 is a method of converting a signal from an analog voltage to a time domain signal, the method comprising: sampling a differential input voltage onto capacitors with a common bottom plate voltage during a sampling period; setting the bottom plate voltage to a first voltage during the sampling period and discharging the capacitors with a fixed current to generate a ramp signal that is common to a differential sampling voltage on the capacitors; supplying the differential sampling voltage to inverters that, when the differential sampling voltage crosses an inverter threshold voltage, trigger a transition of the inverters to switch output clocks from low to high; and holding the ramp voltage at a reset voltage until a next sampling period.

In Example 20, the subject matter of Example 19 further includes scaling a supply voltage to track a common mode voltage of the input voltage.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is submitted with the understanding that it will not be used to limit or interpret the scope or meaning of the claims. The following claims are hereby incorporated into the detailed description, with each claim standing on its own as a separate embodiment.

What is claimed is:

1. A differential voltage-to-time converter (VTC) comprising:
    a ramp generator configured to generate a ramp voltage;
    a differential capacitance comprising first and second capacitors coupled with the ramp generator to receive the ramp voltage; and
    first and second inverters having inputs coupled to the differential capacitance to provide signals based on a sampled signal, the first inverter coupled to the first capacitor, the second inverter coupled to the second capacitor.

2. The differential VTC of claim 1, wherein the ramp generator comprises a ramp capacitor coupled to the differential capacitance, the ramp capacitor coupled to a voltage source through a first reset switch to charge the ramp capacitor and a current source through a second reset switch to discharge the ramp capacitor.

3. The differential VTC of claim 1, wherein the inputs of the first and second inverters are coupled to positive and negative input voltages through first and second sampling switches configured to be synchronously actuated by a sample pulse.

4. The differential VTC of claim 1, wherein the first and second inverters have a fixed threshold.

5. The differential VTC of claim 1, further comprising an inverter supply generation circuit to adjust a supply voltage of the first and second inverters to configure a threshold voltage of the first and second inverters to track a minimum voltage of the sampled signal.

6. The differential VTC of claim 5, wherein the inverter supply generation circuit comprises:
    circuitry configured to generate a shifted version of an input common mode signal,
    a differential amplifier having a first input configured to receive the shifted version of the input common mode signal and an output configured to provide the supply voltage, and
    a replica inverter coupled to a second input of the differential amplifier, a size of the replica inverter proportional to a size of each of the first and second inverters.

7. The differential VTC of claim 6, wherein:
    an input and output of the replica inverter are shorted together,
    the first input of the differential amplifier is a positive input, and
    the second input of the differential amplifier is a negative input.

8. The differential VTC of claim 6, wherein the circuitry comprises:
    a pair of matched resistors configured to receive an input differential signal to generate the common mode signal, and
    a current source coupled with the pair of matched resistors, a junction between the current source and the pair of matched resistors coupled to the first input of the differential amplifier to provide the shifted version of the input common mode signal to the first input of the differential amplifier.

9. The differential VTC of claim 1, further comprising a threshold control circuit coupled to the first and second inverters to control a threshold voltage of the first and second inverters to track a minimum voltage of the sampled signal.

10. The differential VTC of claim 9, wherein the threshold control circuit comprises:
    circuitry configured to generate a shifted version of an input common mode,
    a comparator having a first input configured to receive the shifted version of the input common mode,
    a logic circuit coupled to an output of the comparator, the logic circuit configured to provide a control code based on the output of the comparator, and
    a threshold-tunable inverter coupled to a second input of the comparator, the threshold-tunable inverter configured to receive the control code and adjust the threshold voltage of the first and second inverters based on the control code.

11. The differential VTC of claim 10, wherein the threshold-tunable inverter comprises:
    a plurality of first transconductance devices and a plurality of first switches, each first transconductance device having a source coupled to a first voltage through a corresponding first switch and a gate coupled to an input voltage, and
    a plurality of second transconductance devices and a plurality of second switches, each second transconductance device having a source coupled to a second voltage through a corresponding second switch, a drain coupled to a drain of a corresponding first transconductance device to an output of the threshold-tunable inverter, and a gate coupled to the input voltage, the plurality of first and second switches actuated based on the control code to adjust the threshold voltage.

12. The differential VTC of claim 11, wherein each bit of the control code controls a different one of the plurality of first and second switches.

13. The differential VTC of claim 1, further comprising a plurality of threshold control circuits, each of the threshold control circuits coupled to a different inverter of the first and second inverters to adjust a threshold voltage of the inverter.

14. An electronic device, comprising:
a differential voltage-to-time converter (VTC) comprising:
a ramp generator configured to generate a ramp voltage;
a differential capacitance comprising first and second capacitors having a bottom plate coupled with the ramp generator to receive the ramp voltage; and
first and second inverters having inputs coupled to top plates of the first and second capacitors to provide signals based on a sampled signal, the first inverter coupled to the first capacitor, the second inverter coupled to the second capacitor, at least one of a supply voltage or a threshold voltage of the first and second inverters being adjusted based on environmental conditions; and
a processor configured to receive an output signal from the VTC.

15. The electronic device of claim 14, further comprising an inverter supply generation circuit to adjust a supply voltage of the first and second inverters to configure a threshold voltage of the first and second inverters to track a minimum voltage of the sampled signal.

16. The electronic device of claim 15, wherein the inverter supply generation circuit comprises:
circuitry configured to generate a shifted version of an input common mode signal,
a differential amplifier having a first input configured to receive the shifted version of the input common mode signal and an output configured to provide the supply voltage, and
a replica inverter coupled to a second input of the differential amplifier, a size of the replica inverter proportional to a size of each of the first and second inverters, an input and output of the replica inverter shorted together.

17. The electronic device of claim 14, further comprising a threshold control circuit coupled to the first and second inverters to control a threshold voltage of the first and second inverters to track a minimum voltage of the sampled signal.

18. The electronic device of claim 17, wherein the threshold control circuit comprises:
circuitry configured to generate a shifted version of an input common mode,
a comparator having a first input configured to receive the shifted version of the input common mode,
a logic circuit coupled to an output of the comparator, the logic circuit configured to provide a control code based on the output of the comparator, and
a threshold-tunable inverter coupled to a second input of the comparator, the threshold-tunable inverter configured to receive the control code and adjust the threshold voltage of the first and second inverters based on the control code.

19. A method of converting a signal from an analog voltage to a time domain signal, the method comprising:
sampling a differential input voltage onto capacitors with a common bottom plate voltage during a sampling period;
setting the bottom plate voltage to a first voltage during the sampling period and discharging the capacitors with a fixed current to generate a ramp voltage that is common to a differential sampling voltage on the capacitors;
supplying the differential sampling voltage to inverters that, when the differential sampling voltage crosses an inverter threshold voltage, trigger a transition of the inverters to switch output clocks from low to high; and
holding the ramp voltage at a reset voltage until a next sampling period.

20. The method of claim 19, further comprising scaling a supply voltage to track a common mode voltage of the input voltage.

* * * * *